United States Patent
Ziemak et al.

(10) Patent No.: US 10,806,032 B2
(45) Date of Patent: Oct. 13, 2020

(54) ELECTRONIC SYSTEM COMPRISING AN INTERMEDIATE PRINTED CIRCUIT BOARD FOR A FLUID PROPERTY SENSOR AND FLUID PROPERTY SENSOR

(71) Applicants: TE Connectivity Norge AS, Blomsterdalen (NO); MEAS France, Toulouse (FR)

(72) Inventors: Maciej Ziemak, Fjell (NO); Ion Grozea, Sandsli (NO); Marcin Rusak, Bergen (NO); Bengt Eliassen, Radal (NO); Conrad Judersleben, Bergen (NO); Jose Fernandez, Bergen (NO); Niklas Jansson, Paradis (NO); Rafael Ferrer Ruiz, Toulouse (FR)

(73) Assignees: TE CONNECTIVITY NORGE AS, Blomsterdalen (NO); MEAS FRANCE, Toulouse (FR)

( * ) Notice: Subject to any disclaimer, the term of this patent is extended or adjusted under 35 U.S.C. 154(b) by 0 days.

(21) Appl. No.: 16/196,695

(22) Filed: Nov. 20, 2018

(65) Prior Publication Data

US 2019/0159341 A1 May 23, 2019

(30) Foreign Application Priority Data

Nov. 23, 2017 (CN) .................... 2017 2 1586493 U

(51) Int. Cl.
*H05K 1/00* (2006.01)
*H05K 1/14* (2006.01)
(Continued)

(52) U.S. Cl.
CPC ............. *H05K 1/145* (2013.01); *F01N 3/208* (2013.01); *F01N 3/2066* (2013.01); *G01F 23/30* (2013.01);
(Continued)

(58) Field of Classification Search
CPC .......... H05K 1/145; H05K 2201/10151; F01N 3/2066; F01N 3/208; F01N 2610/02;
(Continued)

(56) References Cited

U.S. PATENT DOCUMENTS 3,735,638 A * 5/1973 Miller .................... G01F 23/24
73/304 R
5,627,523 A 5/1997 Besprozvanny et al.
(Continued)

FOREIGN PATENT DOCUMENTS

CN 102497758 A 6/2012
CN 102887043 A 1/2013
(Continued)

OTHER PUBLICATIONS

Abstract of DE 10 2008 045 153 A1 dated Mar. 4, 2010, 1 page.
(Continued)

*Primary Examiner* — Pete T Lee

(57) ABSTRACT

An electronic system for a fluid property sensor comprises a fluid printed circuit board adapted to analyze a property of a fluid, an external connector, and an intermediate printed circuit board. The intermediate printed circuit board is electrically connected between the fluid printed circuit board and the external connector.

17 Claims, 3 Drawing Sheets

(51) Int. Cl.
| | |
|---|---|
| *F01N 3/20* | (2006.01) |
| *G01F 23/30* | (2006.01) |
| *G01F 23/74* | (2006.01) |
| *H01H 36/02* | (2006.01) |
| *G01F 23/46* | (2006.01) |
| *F02D 41/28* | (2006.01) |

(52) U.S. Cl.
CPC .............. *G01F 23/46* (2013.01); *G01F 23/74* (2013.01); *H01H 36/02* (2013.01); *F01N 2610/02* (2013.01); *F01N 2610/148* (2013.01); *F01N 2900/1814* (2013.01); *F01N 2900/1818* (2013.01); *F02D 2041/285* (2013.01); *H05K 2201/10151* (2013.01)

(58) Field of Classification Search
CPC ....... F01N 2610/148; F01N 2900/1814; F01N 2900/1818; G01F 23/30; G01F 23/46; G01F 23/74; H01H 36/02; F02D 2041/285

See application file for complete search history.

(56) References Cited

U.S. PATENT DOCUMENTS

| | | | |
|---|---|---|---|
| 8,907,663 | B2 | 12/2014 | Lee |
| 9,553,411 | B2 | 1/2017 | Reinhardt et al. |
| 2007/0193345 | A1 | 8/2007 | Yamamoto et al. |
| 2010/0294021 | A1* | 11/2010 | Makino .................. G01N 25/18 73/25.03 |
| 2010/0307237 | A1* | 12/2010 | Prasad ..................... G01F 23/74 73/313 |
| 2013/0033830 | A1* | 2/2013 | Eckhardt ............... G01L 19/003 361/753 |
| 2013/0283906 | A1* | 10/2013 | Jelonek ................. G01F 23/263 73/304 C |
| 2014/0152323 | A1* | 6/2014 | Kumar .................... G01F 23/00 324/658 |
| 2015/0337708 | A1 | 11/2015 | Schlenke et al. |
| 2016/0153819 | A1* | 6/2016 | Unger ............. F02M 35/10386 73/273 |
| 2016/0349157 | A1 | 12/2016 | Brown et al. |

FOREIGN PATENT DOCUMENTS

| | | |
|---|---|---|
| CN | 203255073 U | 10/2013 |
| CN | 204202697 U | 3/2015 |
| DE | 10 2008 045 153 A1 | 3/2010 |
| EP | 1 669 743 A1 | 6/2006 |

OTHER PUBLICATIONS

Abstract of CN 102497758A, dated Jun. 13, 2012, 2 pages.
Abstract of CN 203255073 U, dated Oct. 30, 2013, 1 page.
Abstract of CN 204202697, dated Mar. 11, 2015, 1 page.

* cited by examiner

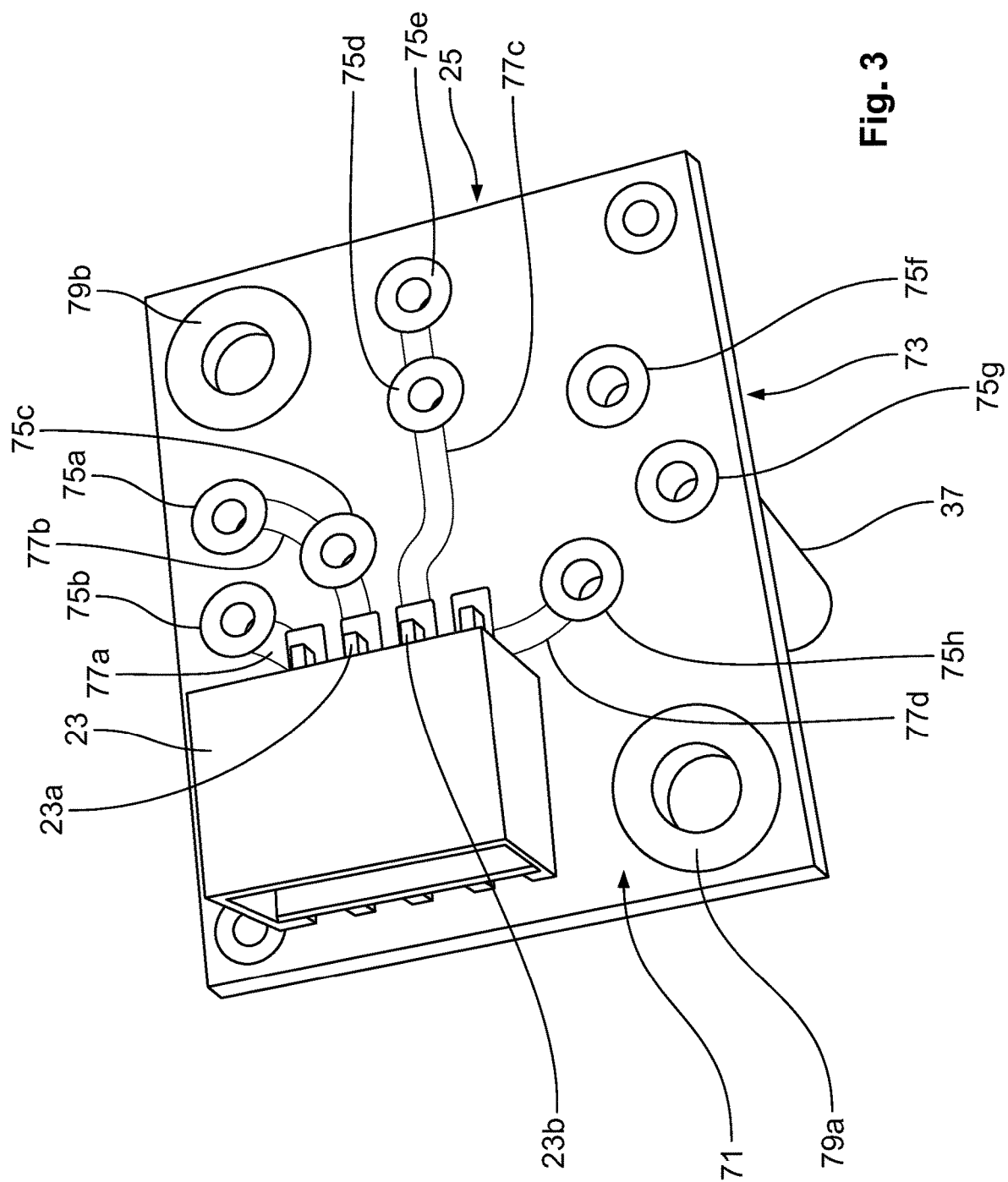

US 10,806,032 B2

ELECTRONIC SYSTEM COMPRISING AN INTERMEDIATE PRINTED CIRCUIT BOARD FOR A FLUID PROPERTY SENSOR AND FLUID PROPERTY SENSOR

CROSS-REFERENCE TO RELATED APPLICATION

This application claims the benefit of the filing date under 35 U.S.C. § 119(a)-(d) of Chinese Patent Application No. 201721586493.7, filed on Nov. 23, 2017.

FIELD OF THE INVENTION

The present invention relates to a fluid property sensor and, more particularly, to an intermediate printed circuit board for a fluid property sensor.

BACKGROUND

Fluid property sensors are widely used in vehicles to, for example, sense the level of fluids such as a fuel in a fuel tank or the level and/or quality of urea in a urea tank. This urea fluid, for example, Diesel Exhaust Fluid (DEF) or Adblue, is used in reduction systems for reducing harmful NOx components in the exhaust gases of Diesel engines. To achieve an efficient reduction of NOx in the exhaust gas, it is important to analyze the quality of the urea solutions and their level inside the tank.

To measure the level of a urea solution in a urea tank, a bank of reed switches provided on a printed circuit board (PCB) are aligned one beside the other and are positioned inside a tube made, for example, of polypropylene (PP). A magnetic float surrounds the tube and, depending on its position on the urea solution, will lead to the switching of a corresponding switch. From the corresponding signal the level of the solution in the tank can be established. Other properties of the urea solution can also be sensed, including the temperature, the concentration, and/or the presence of bubbles.

There is a continuous demand to reduce the size and weight of fluid sensors without losing accuracy or diminishing measurement range. As the space available for the PCB inside the tube is limited and as further functionalities have to be added to the PCB, like grounding or protection components, it is impossible to use the entire extent of the PCB board to place the switches. Furthermore, depending on the customer requirements with respect to the connectivity of the sensor to the harness of the vehicle, it may be necessary to adapt the PCB to the vehicle and therefore it may not be possible to use one standardized PCB.

SUMMARY

An electronic system for a fluid property sensor comprises a fluid printed circuit board adapted to analyze a property of a fluid, an external connector, and an intermediate printed circuit board. The intermediate printed circuit board is electrically connected between the fluid printed circuit board and the external connector.

BRIEF DESCRIPTION OF THE DRAWINGS

The invention will now be described by way of example with reference to the accompanying Figures, of which:

FIG. 3 is a perspective view of an intermediate printed circuit board of the fluid property sensor.

DETAILED DESCRIPTION OF THE EMBODIMENT(S)

Figure 1:
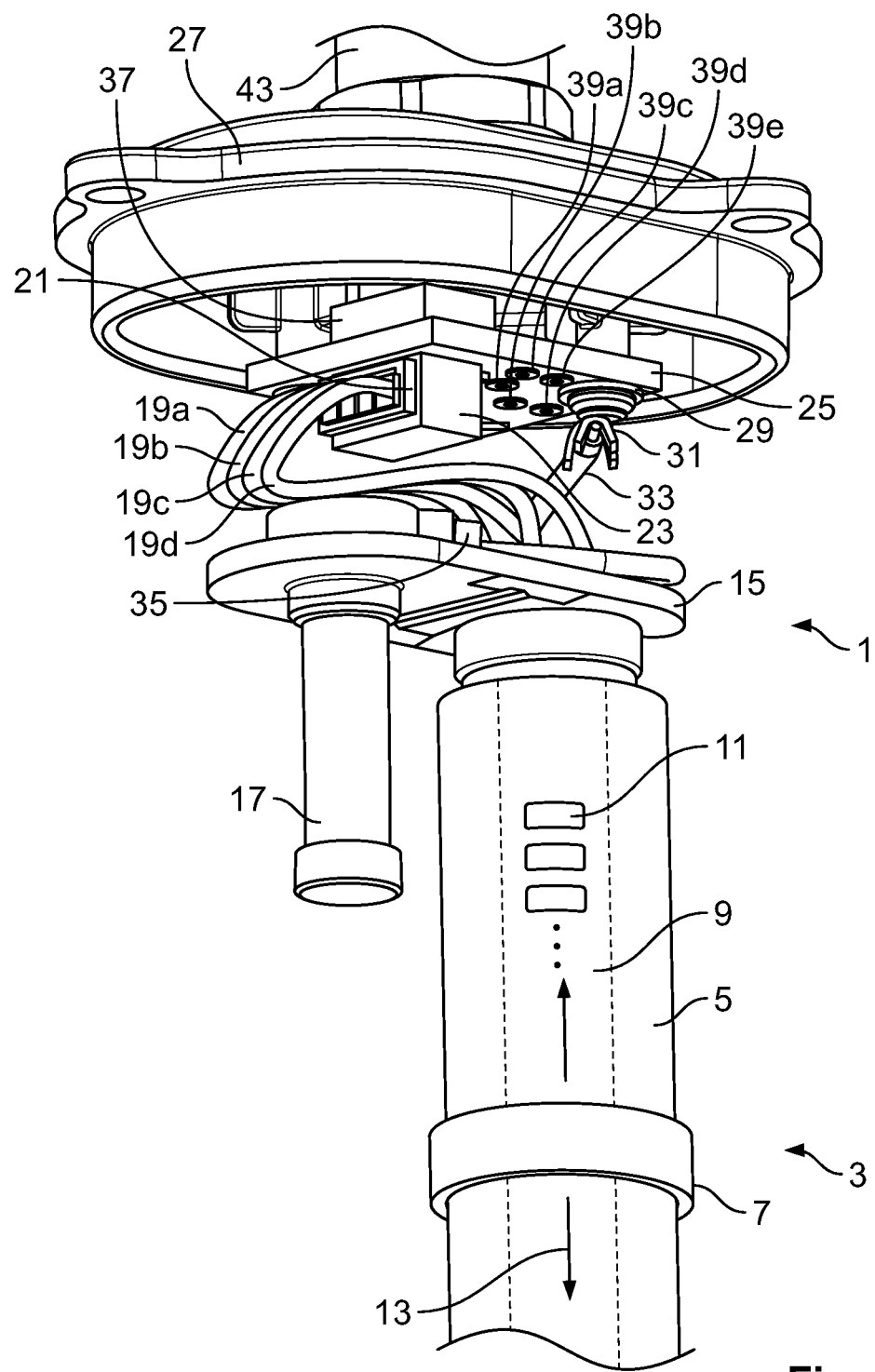
FIG. 1 is a perspective view of a fluid property sensor according to an embodiment.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art.

A fluid property sensor 1 according to an embodiment is shown in FIG. 1. In the shown embodiment, the fluid property sensor 1 is a urea sensor for use in a vehicle. The urea sensor is used to sense a level of urea in a tank (not shown). The urea sensor can also be configured to sense further properties of the urea, like temperature, concentration, the presence of bubbles, etc.

The fluid property sensor 1, as shown in FIG. 1, includes a level sensor 3. The level sensor 3 includes a tube 5 and a float 7 surrounding the tube 5. In an embodiment, the tube 5 is made of polypropylene (PP). In other embodiments, the tube 5 may be formed of any other suitable material.

As shown in FIG. 1, a fluid printed circuit board 9 (PCB) is positioned inside the tube 5. The fluid PCB 9 includes a plurality of switches 11, in particular reed switches. The float 7 has magnetic properties such that, depending on its position with respect to the tube 5 as indicated by the arrows 13, one of the switches 11 positioned adjacent the float 7 will change its state, for example, from open into closed due to the presence of a magnetic field from the float 7. A corresponding electrical signal will then be transmitted from the fluid PCB 9 to an intermediate printed circuit board 25 described in greater detail below.

The tube 5, as shown in FIG. 1, is mounted to a plate 15 mechanically connecting the tube 5 to a metallic connection rod 17. The connection rod 17 carries other parts of the sensor 1, such as a temperature or a quality sensor, for example an ultrasound or optical sensor.

Figure 2:
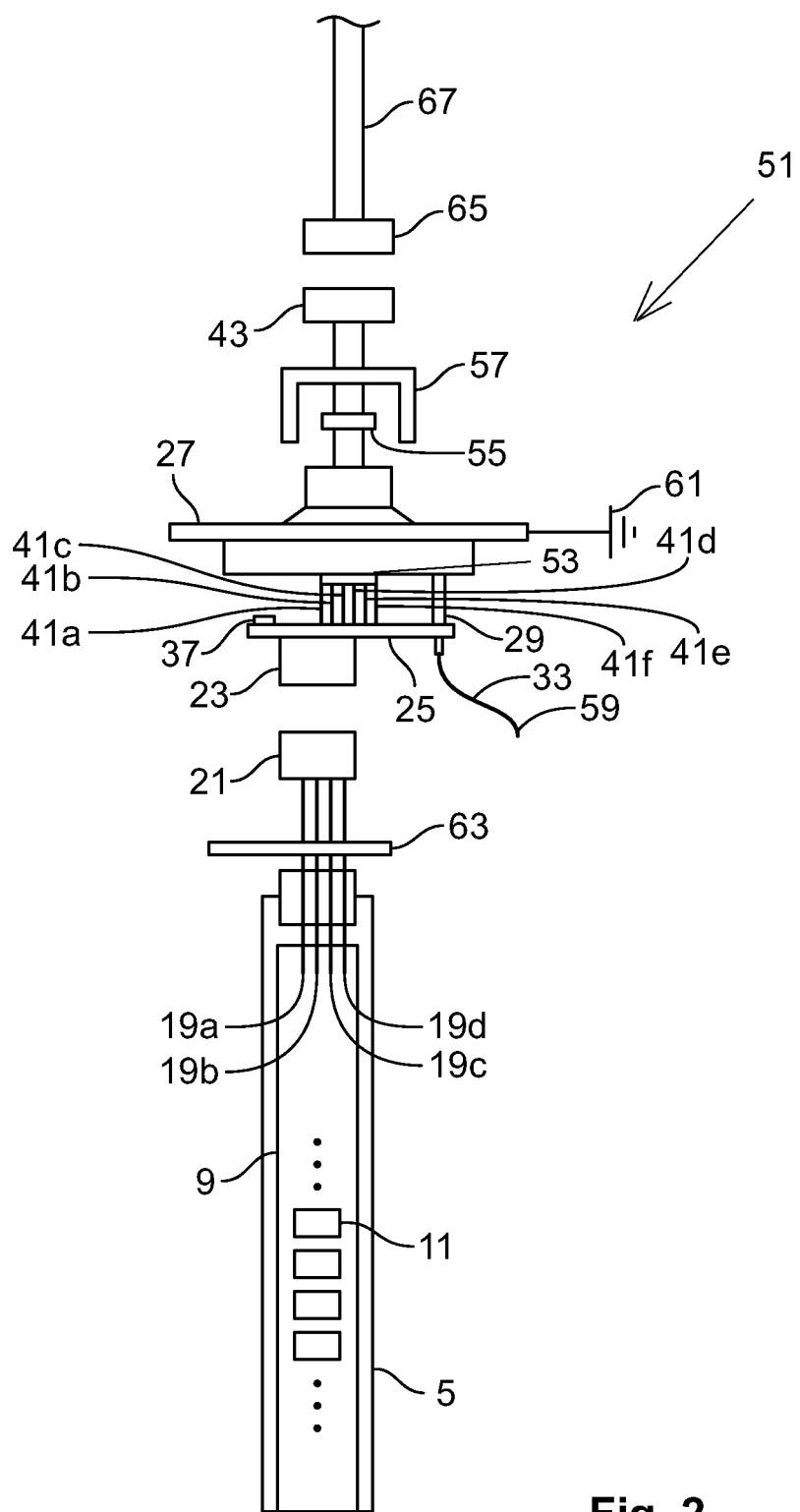
FIG. 2 is an exploded front view of an electronic system of the fluid property sensor.

A plurality of first electric wires 19a-19d shown in FIG. 1 leave the tube 5 via a sealed interface at an upper end of the tube 5. The tube 5 is sealed using a lock feature 63 through which the first wires 19a-19d pass, as shown in FIG. 2. The first wires 19a-19d provide signal and/or power to and from the fluid PCB 9. The first wires 19a-19d in the shown embodiment terminate within a first connector 21. The first wires 19a-19d are soldered on the fluid PCB 9. In an embodiment, the first wires 19a-19d each have a cross-sectional area of less than 0.25 mm². In an embodiment, the first wires 19a-19d each have American Wire Gauge (AWG) values of AWG24 or thinner, such as AWG24 to AWG26.

The first connector 21 is connected to a mating second connector 23 provided on an intermediate printed circuit board 25 (iPCB) as shown in FIG. 1. The iPCB 25 is fixed on the inside of a lid 27. The lid 27 is used to mount the fluid property sensor 1 inside a tank (not shown) and to close the tank. One or more screws 29 are used to fix the iPCB 25 to the lid 27. Using a first cable shoe 31 or any other suitable device, like a soldering pad, a grounding wire 33 is in electrical contact and mechanically fixed to the screw 29 and enables the grounding of the metallic parts of the fluid property sensor 1. The grounding wire 33 is electrically connected using a second cable shoe 35 to the metallic connection rod 17.

By using the screw 29 to connect the grounding wire 33 to the lid 27, which in turn provides grounding as it is in contact with the chassis of the vehicle into which the fluid property sensor 1 is mounted, it is not necessary to use an additional connecting device. Nevertheless, in another embodiment, it is also possible to provide grounding via the grounding wire 33 soldered onto a dedicated soldering pad on the iPCB 25, which in turn is in electrical contact via the lid 27 with the chassis of the vehicle.

The iPCB 25, as shown in FIG. 1, includes a plurality of circuit protection components 37. In an embodiment, the circuit protection components 37 include at least one of an electrostatic discharge protection (ESD), an overvoltage circuit, and a filter circuit for the power provided by a vehicle's battery. The circuit protection components 37 protect signals to and from a bus of the vehicle, such as a CAN bus. This reduces the components necessary on the fluid PCB 9 and also reduces the risk or even prevents possible harmful signals from reaching the more sensitive electronics part of the electronic system or fluid property sensor 1. The iPCB 25 includes a plurality of additional connection pads 39*a*-39*e* to which wires of forming an electrical connection with an external connector 43 are connected, for example, by soldering. The iPCB 25 can further provide termination to the CAN bus, depending on customer requirements. This provides the option to be either permanently or selectively connected by a vehicle harness 67. Identical sensors can then be used either as an end node or a stub node on the vehicle's CAN bus, which allows reducing the amount of different articles. The iPCB 25 can, for instance, accommodate various CAN bus interfaces, depending on different customer preferences and specifications.

As shown in FIG. 2, a plurality of second wires 41 could be connected to the iPCB 25 in addition to the plurality of first wires 19*a*-19*d* coming from the tube 5. Particular customer requirements can thus be taken into account. In an exemplary embodiment, it is possible to duplicate connections to provide redundancy. Two wires out of the second wires 41 are in contact with one first wire 19*a*, two other wires of the second wires 41 are in contact with one first wire 19*b*, etc. Furthermore, in an embodiment, the size of the second wires 41 and the first wires 19*a*-19*d* may be different; the second wires 41 can be thicker than the first wires 19*a*-19*d* leaving the tube 5 as the design constraints are lower outside the tube 5. A necessary volume for the first wires 19*a*-19*d* inside the sensor can then be reduced even in cases where outside the sensor, larger diameter second wires 41*a*-41*h* are wanted or needed. In another embodiment, input-output series connections could be realized. In an embodiment, the second wires 41*a*-41*h* include two wires to connect to a battery of the vehicle and two wires to connect CAN bus signals, such as a CAN H and a CAN L.

An electronic system 51 according to an embodiment used in the fluid property sensor 1 is shown in FIG. 2. The electronic system 51 includes the fluid PCB 9, the iPCB 25, and the external connector 43.

As shown in FIG. 2, the fluid PCB 9 includes the switches 11 used to establish the level of urea in the tank. In the shown embodiment, four first wires 19*a*-19*d* are connected to the fluid PCB 9 by soldering. The four first wires 19*a*-19*d* are also connected to the first connector 21 mating with the second connector 23 of the iPCB 25. Second wires 41*a*-41*f* are connected to the iPCB 25, for example, by soldering or using additional connectors. The second wires 41*a*-41*f* extend to the external connector 43. The shown embodiment includes four first wires 19*a*-19*d* and six second wires 41*a*-41*f*. In other embodiments, however, more or less first wires 19 or second wires 41 could be used. In the shown embodiment, more second wires 41 are used between the iPCB 25 and the external connector 43 than first wires 19 between the iPCB 25 and the fluid PCB 9; the iPCB 25 includes a greater number of electrical connections with the external connector 43 than with the fluid PCB 9.

As shown in FIG. 2, the second wires 41*a*-41*f* pass through an opening 53 in the lid 27. A seal 55 and a cover 57 are used to fix the second wires 41-41*f* and seal the connection. The cover 57 can be designed such that it also provides stress relief for the whole device.

The grounding wire 33, as shown in FIG. 2, is connected to the iPCB 25 at a first terminal end of the grounding wire 33 and an opposite second terminal end 59 can be connected to metallic parts of the fluid property sensor 1. Via screw 29, the grounding wire 33 can be connected to the lid 27, that is grounded 61 by an electrical connection to the chassis of the vehicle (not shown).

The external connector 43, as shown in FIG. 2, can be electrically and mechanically connected to a mating connector 65 of a vehicle harness 67.

An embodiment of the iPCB 25 is shown in FIG. 3. The second connector 23 is positioned on a first side 71 of the iPCB 25 towards the tube 5 with the fluid PCB 9 in the mounted state, and circuit protection components 37 are positioned on a second side 73 of the iPCB 25 opposite the first side 71.

As shown in FIG. 3, a plurality of first metallically coated passageways 75*a*-75*h* extend through the iPCB 25 and link the first side 71 and the second side 73 of the iPCB 25. In an embodiment, the second wires 41*a*-41*f* can be soldered to the first passageways 75*a*-75*h* using bonding pads on the second side 73.

The iPCB 25 has a plurality of connection lines 77*a*-77*d* shown in FIG. 3 to electrically connect the first passageways 75*a*-75*h* to the second connector 23. In the shown embodiment, first passageways 75*a* and 75*c* are connected together to one entry 23*a* of the second connector 23 and first passageways 75*d* and 75*e* are connected together to another entry 23*b* of the second connector. A redundancy can thus be provided when two of the second wires 41*a*-41*f* are connected to the corresponding bonding pads. In case one second wire 41*a*-41*f* breaks, the other second wire 41*a*-41*f* can still provide the signal or the power necessary to the functioning of the fluid property sensor 1. In another embodiment, the connection lines 77*a*-77*d* and the first passageways 75*a*-75*h* can be arranged to provide a input-output series connection to connect the fluid property sensor 1 in a daisy chain configuration.

A plurality of second metallically coated passageways 79*a* and 79*b* extend through the iPCB 25, as shown in FIG. 3, and can be used to fix the iPCB 25 to the lid 27 as shown in FIGS. 1 and 2 using the screws 29. With the metallic coating of the second passageways 79*a* and 79*b* it becomes possible to ground the iPCB 25 and other metallic parts of the fluid property sensor 1 via the lid 27 and a connection to the chassis of the vehicle in which the sensor 1 is installed.

By moving the grounding feature and the circuit protection to the iPCB 25 as described above, the fluid PCB 9 can be dedicated to the measurement of the level of the urea fluid. Height for the measured level can be saved in the tube 5, as no space has to be reserved for these extra features. As other components are placed on the iPCB 25, the entire available surface of the fluid PCB 9 can be used for reed switches 11, and an effective height range of the sensor 1 is improved. In addition, due to the use of small first wires 19a-19d and the use of only four first wires 19a-19d, the space needed inside the tube 5 can be reduced. Furthermore, the design of the fluid PCB 9 and its connection to the iPCB 25 can be kept the same independent of the requirements of the users. Only the iPCB 25 has to be adapted, which simplifies the design and allows a better standardization of the parts used for the fluid property sensor 1.

What is claimed is:

1. An electronic system for a fluid property sensor, comprising:
a fluid printed circuit board adapted to analyze a property of a fluid;
an external connector; and
an intermediate printed circuit board electrically connected between the fluid printed circuit board and the external connector, the fluid printed circuit board is electrically connected to the intermediate printed circuit board by a plurality of first wires and the intermediate printed circuit board is electrically connected to the external connector by a plurality of second wires, a quantity of the first wires is less than a quantity of the second wires.

2. The electronic system of claim 1, further comprising a metallic connection rod connected to the intermediate printed circuit board, the metallic connection rod configured to provide grounding of the fluid property sensor.

3. The electronic system of claim 1, wherein the intermediate printed circuit board includes a plurality of circuit protection components including at least one of an electrostatic discharge protection, an overvoltage circuit, and a filter circuit.

4. The electronic system of claim 1, wherein the second wires are redundantly connected between the intermediate printed circuit board and the external connector or provide a connection in a daisy chain configuration with an input-output series connection between the intermediate printed circuit board and the external connector.

5. The electronic system of claim 1, wherein the second wires each have a larger diameter than the first wires.

6. The electronic system of claim 5, wherein the plurality of first wires include at most four first wires.

7. The electronic system of claim 5, wherein each of the first wires has a cross-sectional area of 0.25 mm$^2$ or less.

8. The electronic system of claim 1, further comprising a first connector electrically connected to the fluid printed circuit board and a second connector disposed on the intermediate printed circuit board, the first connector is matable with the second connector to electrically connect the fluid printed circuit board with the intermediate printed circuit board.

9. The electronic system of claim 1, further comprising a plurality of switches disposed on the fluid printed circuit board and adapted to sense a level of the fluid in a tank.

10. The electronic system of claim 9, wherein each of the switches is a reed switch.

11. A fluid property sensor, comprising:
an electronic system including a fluid printed circuit board adapted to analyze a property of a fluid, an external connector, and an intermediate printed circuit board electrically connected between the fluid printed circuit board and the external connector, the fluid printed circuit board is electrically connected to the intermediate printed circuit board by a plurality of first wires and the intermediate printed circuit board is electrically connected to the external connector by a plurality of second wires, a quantity of the first wires is less than a quantity of the second wires.

12. The fluid property sensor of claim 11, further comprising a lid adapted to close a tank receiving the fluid property sensor.

13. The fluid property sensor of claim 12, wherein the intermediate printed circuit board is mounted on or into the lid.

14. The fluid property sensor of claim 13, wherein the intermediate printed circuit board is mounted to the lid with a screw, and a plurality of sensor components of the electronic system are grounded via the screw and the lid.

15. The fluid property sensor of claim 12, further comprising a plurality of switches disposed on the fluid printed circuit board and adapted to sense a level of the fluid in the tank.

16. The fluid property sensor of claim 15, wherein each of the switches is a reed switch.

17. A fluid property sensor, comprising:
an electronic system including a fluid printed circuit board adapted to analyze a property of a fluid, an external connector, and an intermediate printed circuit board electrically connected between the fluid printed circuit board and the external connector; and
a lid adapted to close a tank receiving the fluid property sensor, the intermediate printed circuit board is mounted on or into the lid, the intermediate printed circuit board is mounted to the lid with a screw, a plurality of sensor components of the electronic system are grounded via the screw and the lid.

* * * * *